(12) United States Patent
Yin et al.

(10) Patent No.: US 12,323,715 B2
(45) Date of Patent: Jun. 3, 2025

(54) IMAGE SENSOR CIRCUIT AND IMAGE SENSOR DEVICE

(71) Applicant: Guangzhou Tyrafos Semiconductor Technologies Co., Ltd., Guangzhou (CN)

(72) Inventors: Ping-Hung Yin, Hsinchu (TW); Jia-Shyang Wang, Miaoli County (TW); Shih-Chan Tai, Kaohsiung (TW)

(73) Assignee: Guangzhou Tyrafos Semiconductor Technologies Co., Ltd., Guangzhou (CN)

( * ) Notice: Subject to any disclaimer, the term of this patent is extended or adjusted under 35 U.S.C. 154(b) by 204 days.

(21) Appl. No.: 18/142,596

(22) Filed: May 3, 2023

(65) Prior Publication Data

US 2023/0388666 A1   Nov. 30, 2023

Related U.S. Application Data

(60) Provisional application No. 63/345,920, filed on May 26, 2022.

(51) Int. Cl.
*H04N 25/10* (2023.01)
*G06T 3/4015* (2024.01)
(Continued)

(52) U.S. Cl.
CPC .......... *H04N 25/10* (2023.01); *G06T 3/4015* (2013.01); *G06T 5/50* (2013.01); *H04N 7/0127* (2013.01); *H04N 23/13* (2023.01); *H04N 23/45* (2023.01); *H04N 23/52* (2023.01); *H04N 23/56* (2023.01); *H04N 23/70* (2023.01); *H04N 23/73* (2023.01); *H04N 23/74* (2023.01); *H04N 23/741* (2023.01); *H04N 23/75* (2023.01); *H04N 23/76* (2023.01); *H04N 23/815* (2023.01); *H04N 23/951* (2023.01); *H04N 25/11* (2023.01);
(Continued)

(58) Field of Classification Search
None
See application file for complete search history.

(56) References Cited

U.S. PATENT DOCUMENTS

| 2009/0066782 A1* | 3/2009 | Choi | H04N 25/46 348/E5.022 |
| 2017/0099449 A1* | 4/2017 | Kang | H04N 23/672 |

(Continued)

FOREIGN PATENT DOCUMENTS

WO   WO2013119706   * 8/2013

*Primary Examiner* — Christopher Braniff (57) ABSTRACT

Disclosed are an image sensor circuit and an image sensor device including the image sensor circuit device. The image sensor circuit includes a pixel array formed by a plurality of pixel circuits. Each pixel circuit includes a first sub-pixel circuit, a first control circuit, a second sub-pixel circuit and a second control circuit. The first control circuit may sense light in a first wavelength range and control the first sub-pixel circuit to output a first output information at a first frame rate. The second control circuit may sense light in a second wavelength range and control the second sub-pixel circuit to output a second output information at a second frame rate. The first frame rate is higher than the second frame rate, and the first wavelength range does not overlap with the second wavelength range.

10 Claims, 8 Drawing Sheets

(51) Int. Cl.
| | |
|---|---|
| *G06T 5/50* | (2006.01) |
| *H04N 7/01* | (2006.01) |
| *H04N 23/13* | (2023.01) |
| *H04N 23/45* | (2023.01) |
| *H04N 23/52* | (2023.01) |
| *H04N 23/56* | (2023.01) |
| *H04N 23/70* | (2023.01) |
| *H04N 23/73* | (2023.01) |
| *H04N 23/74* | (2023.01) |
| *H04N 23/741* | (2023.01) |
| *H04N 23/75* | (2023.01) |
| *H04N 23/76* | (2023.01) |
| *H04N 23/80* | (2023.01) |
| *H04N 23/951* | (2023.01) |
| *H04N 25/11* | (2023.01) |
| *H04N 25/13* | (2023.01) |
| *H04N 25/47* | (2023.01) |
| *H04N 25/50* | (2023.01) |
| *H04N 25/533* | (2023.01) |
| *H04N 25/535* | (2023.01) |
| *H04N 25/58* | (2023.01) |
| *H04N 25/583* | (2023.01) |
| *H04N 25/59* | (2023.01) |
| *H04N 25/75* | (2023.01) |
| *H04N 25/77* | (2023.01) |
| *H04N 25/771* | (2023.01) |
| *H04N 25/78* | (2023.01) |
| *H10D 89/60* | (2025.01) |
| *H10F 39/00* | (2025.01) |
| *H10F 39/18* | (2025.01) |

(52) U.S. Cl.
CPC ......... *H04N 25/134* (2023.01); *H04N 25/135* (2023.01); *H04N 25/47* (2023.01); *H04N 25/50* (2023.01); *H04N 25/533* (2023.01); *H04N 25/535* (2023.01); *H04N 25/58* (2023.01); *H04N 25/583* (2023.01); *H04N 25/59* (2023.01); *H04N 25/75* (2023.01); *H04N 25/77* (2023.01); *H04N 25/771* (2023.01); *H04N 25/78* (2023.01); *H10D 89/611* (2025.01); *H10F 39/18* (2025.01); *H10F 39/8023* (2025.01); *H10F 39/8037* (2025.01); *G06T 2207/20208* (2013.01); *G06T 2207/20221* (2013.01)

(56) References Cited

U.S. PATENT DOCUMENTS

2017/0347047 A1* 11/2017 Mao ..................... H10F 39/813
2022/0165775 A1* 5/2022 Jin ..................... H01L 27/1462

* cited by examiner

IMAGE SENSOR CIRCUIT AND IMAGE SENSOR DEVICE

CROSS-REFERENCE TO RELATED APPLICATION

This application claims the priority of U.S. patent application No. 63/345,920, filed on May 26, 2022, which is incorporated herewith by reference.

BACKGROUND OF THE INVENTION

1. Field of the Invention

The present invention relates to an image sensor, particularly to an image sensor device that can simultaneously perform motion detections and image recordings.

2. The Prior Arts

Today, image sensors are widely used in various fields such as dashcams, monitors, and cameras. The purpose of image sensing can be divided into two main types: obtaining and recording image picture data, and monitoring real-time motion changes in the screen. Different sensing conditions are required for different image sensing purposes. For example, when the purpose of image sensing is to record images, users often want to record high-quality, clear, full-color images. In contrast, when the purpose of image sensing is only to monitor whether there is motion in the picture, there are high requirements for sensitivity of the motion of the object, but not high requirements for color information. For example, the Dynamic Vision Sensor (DVS) has been widely used in various technical fields, such as self-driving car technology. However, traditional motion detection and image recording are usually implemented separately by two sets of sensor circuits or readout circuits, which doubles the hardware cost and circuit complexity. Therefore, it is desirable to develop a technology to achieve both image sensing purposes at the same time with a low hardware cost.

SUMMARY OF THE INVENTION

Based on the above, the image sensor circuit and the image sensor device of the present invention can be used to sense light in an environment. The image sensor device includes at least the image sensor circuit, which comprises at least one pixel circuit composed of a first sub-pixel circuit and a second sub-pixel circuit to form a pixel array. The first sub-pixel circuit of each pixel circuit can sense light in a first wavelength range and generate a first sensed signal at a first frame rate, while the second sub-pixel circuit can sense light in a second wavelength range and generate a second sensed signal at a second frame rate. When implemented, the image sensor circuit can be controlled by an external control circuit to output the first output information from the first sub-pixel circuit of each pixel circuit at the first frame rate and to output the second output information from the second sub-pixel circuit at the second frame rate. The first frame rate is higher than the second frame rate, and the first wavelength range and the second wavelength range do not overlap. Alternatively, the image sensor circuit may include a first control circuit and a second circuit to control the image sensor circuit. The first control circuit can control the first sub-pixel circuit of each pixel circuit to output the first output information at the first frame rate, while the second control circuit can control the second sub-pixel circuit to output the second output information at the second frame rate. The first frame rate is higher than the second frame rate, and the first wavelength range and the second wavelength range do not overlap with each other.

Furthermore, the present invention discloses an embodiment of an image sensor circuit that combines motion detection and image recording functions. The image sensor circuit comprises at least one pixel circuit composed of a first sub-pixel circuit and a second sub-pixel circuit that form a pixel array, a first control circuit, and a second control circuit. The first sub-pixel circuit is configured to sense light in a first wavelength range. The first control circuit is coupled to the first sub-pixel circuit and is configured to control the first sub-pixel circuit to output a first output information after photo-exposing the first sub-pixel circuit for a first exposure duration. The second sub-pixel circuit is configured to sense light in a second wavelength range. The second control circuit is coupled to the second sub-pixel circuit and is configured to control the second sub-pixel circuit to output a second output information after photo-exposing the second sub-pixel circuit for a second exposure duration. The first control circuit is also configured to control the first sub-pixel circuit to output the first output information at a first frame rate. The second control circuit is also configured to control the second sub-pixel circuit to output the second output information at a second frame rate. The first frame rate is higher than the second frame rate, and the first wavelength range does not overlap with the second wavelength range.

In another embodiment, the image sensor circuit further includes a readout circuit coupled to the first sub-pixel circuit and the second sub-pixel circuit, configured to read the first output information and the second output information. The first control circuit and the second control circuit alternatively control the readout circuit using a reset signal, so that the readout circuit generates a readout signal based on either the first output information or the second output information.

In a further embodiment, the readout circuit includes a ramp capacitor. The function of the ramp capacitor is to couple a ramp voltage signal to a floating diffusion node, causing the voltage at the floating diffusion node to increase over time, and then comparing it with another reference voltage for analog-to-digital conversion. The first end of the ramp capacitor is coupled to the floating diffusion node, and the second end of the ramp capacitor is connected in series with a ramp voltage. The readout circuit is controlled by a selection signal, and the potential of the floating diffusion node is converted into the readout signal following a specific timing sequence.

In a further embodiment, the image sensor circuit may be a rolling shutter structure.

The first sub-pixel circuit includes a first photodiode configured to accumulate charges by sensing light, and a first switch coupled to the first photodiode and the floating diffusion node, and controlled to be conductive by the first control circuit. When the first control circuit transmits a first transfer signal to make the first switch conductive, and transmits a reset signal to couple the first switch to a reset voltage, the accumulated charges in the first photodiode is reset.

When the first control circuit sends the first transmission signal to turn on the first switch, but does not send the reset signal, the charges accumulated in the first photodiode generates the first output information which is then transmitted to the floating diffusion node. When the readout circuit is triggered by the selection signal, the readout circuit converts the first output information stored at the floating diffusion node into a first readout signal.

In another embodiment, the image sensor circuit may be a global shutter structure. The first control circuit transmits a first global transmission signal to the first sub-pixel circuit, causing the first sub-pixel circuit to buffer a first photographic quantity based on the first global transmission signal. The second control circuit transmits a second global transmission signal to the second sub-pixel circuit, causing the second sub-pixel circuit to buffer a second photographic quantity based on the second global transmission signal. The frequency of transmission of the first global transmission signal is a multiple of the frequency of transmission of the second global transmission signal, which can be an integer or a non-integer.

In a further embodiment, the first sub-pixel circuit includes a first photodiode configured to accumulate photographic quantities, and a first buffer circuit coupled to the first photodiode adapted to read and store the first photographic quantity from the first photodiode based on the first global transmission signal. The second sub-pixel circuit includes a second photodiode configured to accumulate photographic quantities, and a second storage circuit coupled to the second photodiode, adapted to read and store the second photographic quantity from the second photodiode based on the second global transmission signal. When the first buffer circuit reads the first photographic quantity, the first control circuit transmits a first reset signal to the first sub-pixel circuit to reset the first photodiode to a reset voltage. When the second storage circuit reads the second photographic quantity, the second control circuit transmits a second reset signal to the second sub-pixel circuit to reset the second photodiode to the reset voltage. The frequency of transmission of the first reset signal is a multiple of the frequency of transmission of the second reset signal, which can be an integer or a non-integer.

In a further embodiment, when the first buffer circuit completes buffering the first photographic quantity, the first control circuit sends the reset signal to reset the floating diffusion node and subsequently sends a first transfer signal to output the first photographic quantity from the first buffer circuit to the readout circuit. When the second buffer circuit completes buffering the second photographic quantity, the second control circuit sends the reset signal to reset the floating diffusion node and subsequently sends a second transfer signal to output the second photographic quantity from the second buffer circuit to the readout circuit. The frequency of transmission of the first transfer signal is a multiple of the frequency of transmission of the second transfer signal, which can be an integer or a non-integer.

In a further embodiment, the first exposure duration is shorter than the second exposure duration, the first wavelength range is in the infrared light range, and the second wavelength range is in the visible light range. The first frame rate can be a multiple of the second frame rate, which can be an integer or a non-integer.

Another embodiment of an image sensor device is provided for detecting motion and capturing images. The image sensor device includes an image sensor chip incorporating the image sensor circuit of the previous embodiment. The image sensor circuit includes multiple pixel circuits. Each pixel circuit includes a first sub-pixel circuit covered with an infrared filter and configured to sense infrared light, and a second sub-pixel circuit covered with a visible light filter and configured to sense visible light. The image sensor chip further includes an analog-to-digital converter, an image processing module, and a dynamic sensor module. The analog-to-digital converter is coupled to the image sensor circuit and configured to convert the infrared light signal sensed by the first sub-pixel circuit into motion detection signals at a first frame rate, and the visible light signal sensed by the second sub-pixel circuit into an image signal at a second frame rate, with the first frame rate higher than the second frame rate. The image processing module is coupled to the analog-to-digital converter and is configured to perform image encoding, storage, and output processing on the image signal. The dynamic sensor module is coupled to the analog-to-digital converter and is configured to determine changes in the motion detection signals. In a further embodiment, the image sensor device further includes a light-emitting diode (LED) coupled to the image sensor chip and configured to emit infrared light. The image sensor device further includes a LED driver circuit coupled to the LED and configured to drive or provide power to the LED to emit the infrared light.

In summary, the circuit architecture of the present invention contains at least the following advantages. The image sensor circuit is equipped with two control circuits with different frame rates, so that different sub-pixels in the same set of pixel circuits output data at different frame rates. Accordingly, the image sensor circuit of the present invention does not need to significantly add additional pixel circuits, but generates the data required for two distinct functions using just the same set of pixel circuits, thereby simultaneously realizing high-quality picture recordings and sensitive motion detections.

BRIEF DESCRIPTION OF THE DRAWINGS

The drawings shown herein are used to provide a further understanding of the present invention and form part of the present invention, and the schematic embodiments of the present invention and its description are used to interpret the present invention and do not constitute an improper limitation of the present invention. In the drawings.

DETAILED DESCRIPTION OF THE PREFERRED EMBODIMENT

The following will be combined with the drawings in the embodiment of the present invention, and the technical solution in the embodiment of the present invention is clearly and completely described. Obviously, the described embodiment is a part of the embodiment of the present invention, not all embodiments. Based on the embodiments in the present invention, all other embodiments obtained by ordinary knowledge of the technical field without creative endeavors are within the scope of protection of the present invention.

Figure 1:
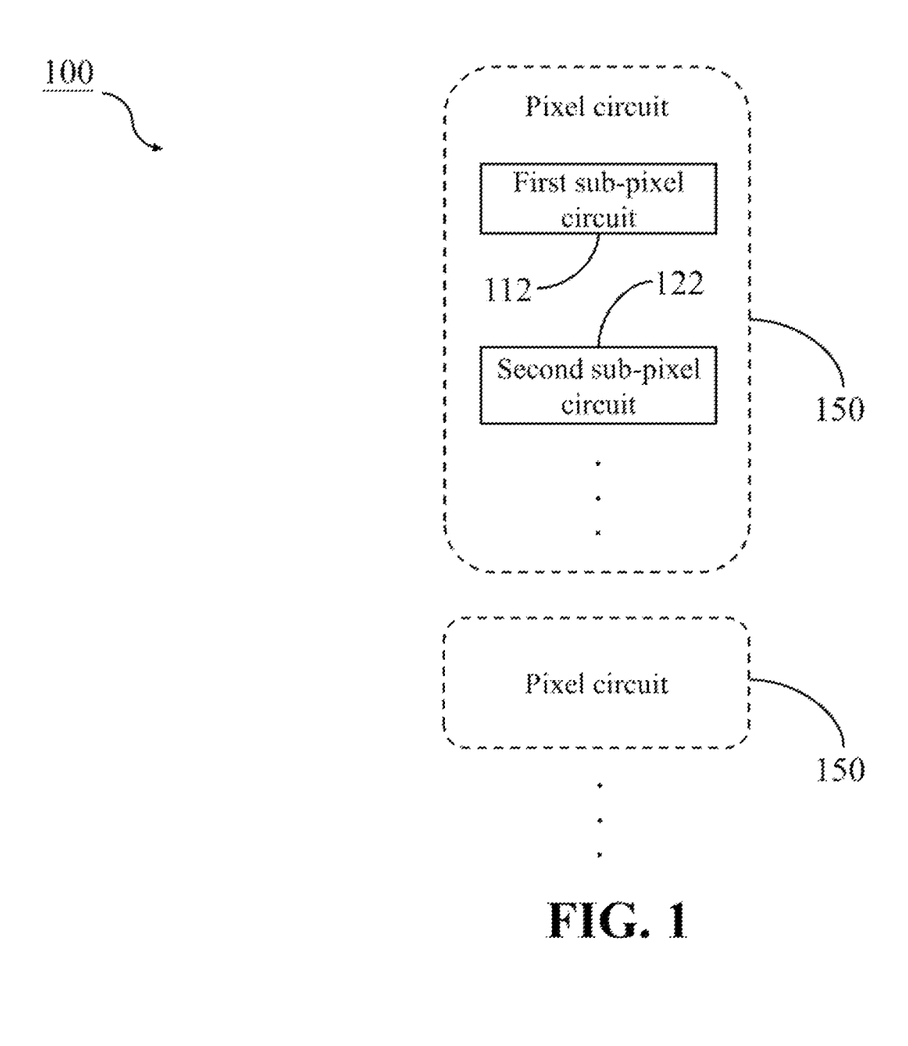
FIG. 1 shows a schematic diagram of the image sensor circuit of the present invention.

FIG. 1 is a schematic diagram of the image sensor circuit of the present invention. As for the image sensor circuit and image sensor device of the present invention, the image sensor circuit 100 includes at least one pixel circuit 150. The pixel circuit 150 includes at least one pixel array comprising at least a first sub-pixel circuit 112 and a second sub-pixel circuit 122. The first sub-pixel circuit 112 of the image sensor circuit 100 can sense light in a first wavelength range and generate a first sensed signal at a first frame rate, and the second sub-pixel circuit 122 can sense light in a second wavelength range and generate a second sensed signal at a second frame rate.

In practical implementation of the present invention, the pixel circuit 150 of the image sensor circuit 100 can be controlled by an external control circuit to output the first output information at a first frame rate from the first sub-pixel circuit 112 and the second output information at a second frame rate from the second sub-pixel circuit 122, where the first frame rate is higher than the second frame rate, and the first wavelength range is different from the second wavelength range. Alternatively, the image sensor circuit 100 may include a first control circuit (not shown) and a second control circuit (not shown) to control the pixel circuit 150 of the image sensor circuit 100. The first control circuit can control the first sub-pixel circuit to output the first output information at the first frame rate, and the second control circuit can control the second sub-pixel circuit to output the second output information at the second frame rate, where the first frame rate is higher than the second frame rate, and the first wavelength range is different from the second wavelength range. The first and second control circuits can each have their own independent address decoder to respectively control the first frame rate and the second frame rate.

Furthermore, for example, when the image sensor circuit 100 includes a first control circuit (not shown) and a second control circuit (not shown), the first control circuit can control the first sub-pixel circuit 112 to expose for a first exposure duration and output the first sensed signal at the first frame rate. Similarly, the second control circuit can control the second sub-pixel circuit 122 to expose for a second exposure duration and output the second sensed signal at the second frame rate. For instance, the first exposure duration may be shorter than the second exposure duration, and the first frame rate may be higher than the second frame rate.

In general image recording applications, a frame rate of 30 frames per second (FPS) is sufficient for human vision. In Dynamic Vision Sensors (DVS), the front and rear frames of image recording are usually used for differential comparison to obtain dynamic information of the image. In some high-speed motion scenarios, the image recording frame rate is required to be increased several times, such as 300 fps, to achieve the intended detection performance. However, this high frame rate image data is not helpful for user experience, consuming significant bandwidth resources for transmission and storage, which also affects the hardware design cost and yield. The circuit architecture and corresponding operating method proposed by the present invention can achieve intra-frame motion detection without significantly increasing hardware costs. In the embodiments of the present invention, most sub-pixels perform image recording at the traditional frame rate, while a small number of sub-pixels perform motion detection at a high frame rate. In other words, the motion detection can be performed several times within the duration to record one image frame. The present invention is advantageous in that the product design neither requires additional hardware cost, nor extra calculation resources for data processing and transmission. The application of the present invention is particularly suitable for driving recorders or autonomous driving systems. For example, while the car is recording at 30 fps, motion detection can be performed at 300 fps, and the detection results can be transmitted to the autonomous driving algorithm, automatic braking system, or warning system in real-time. The warning system can issue an audible/visual alert to the driver as appropriate.

Figure 2:
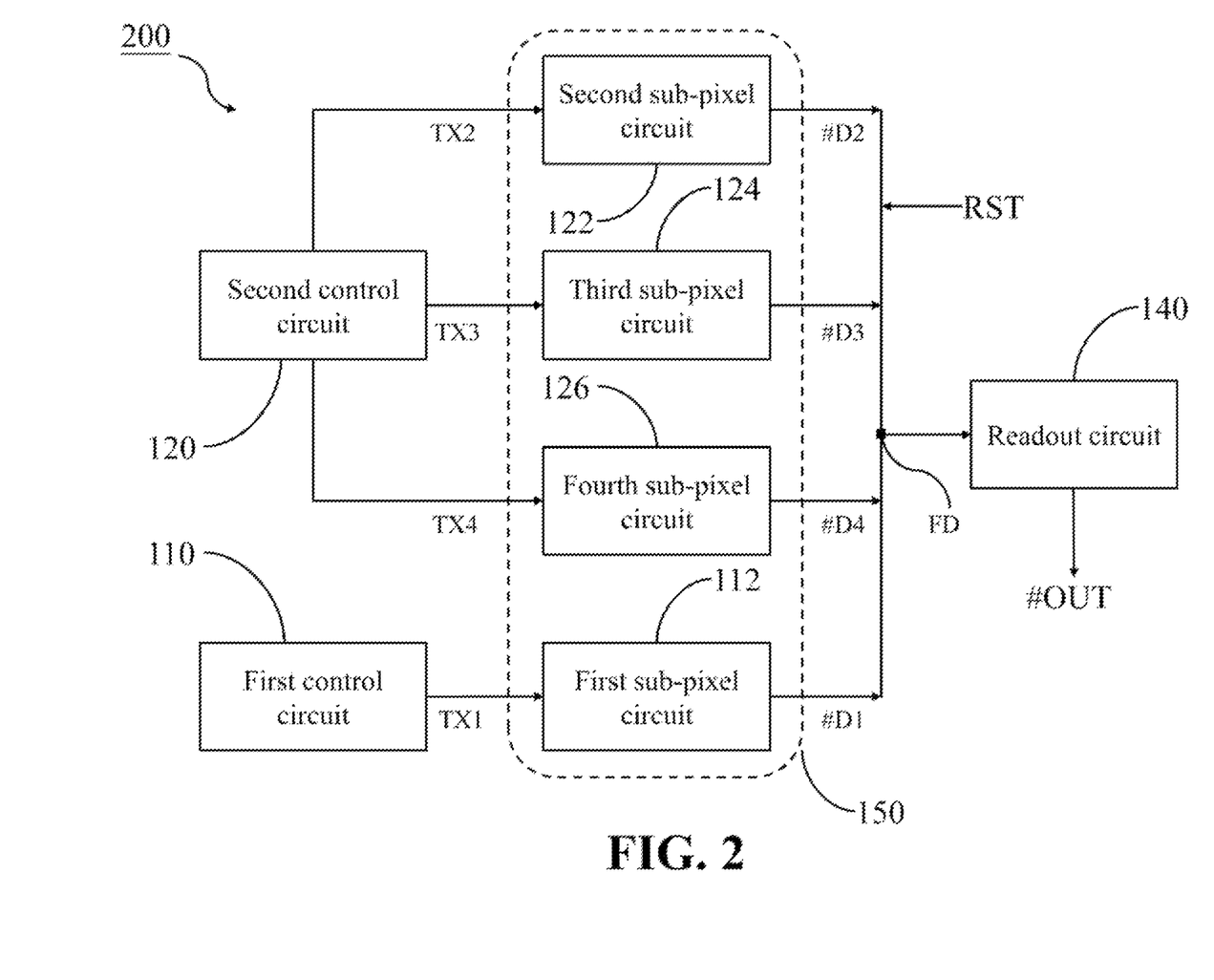
FIG. 2 shows a sensor circuit architecture diagram of an embodiment of the present invention.

FIG. 2 is a schematic diagram of the sensor circuit architecture of an embodiment of the present invention. The present invention proposes an implementation of an image sensor circuit that combines both motion detection and image recording functions. The image sensor circuit 100 includes multiple pixel circuits for sensing light, each of which includes a first sub-pixel circuit 112, a second sub-pixel circuit 122, and a second control circuit 120. The image sensor circuit 100 includes at least one pixel circuit 150, which comprises at least a first sub-pixel circuit 112 and a second sub-pixel circuit 122 in a pixel array. The first sub-pixel circuit 112 of the image sensor circuit 100 can sense light in a first wavelength range and generate a first sensed signal at a first frame rate, and the second sub-pixel circuit 122 can sense light in a second wavelength range and generate a second sensed signal at a second frame rate.

In implementation of the present invention, the pixel circuit 150 of the image sensor circuit 100 can be controlled through an external control circuit including a first control circuit 110 and a second control circuit 120. The first control circuit 110 controls the first sub-pixel circuit 112 to output the first output information at a first frame rate, while the second control circuit 120 controls the second sub-pixel circuit 122 to output the second output information at a second frame rate. The first frame rate is higher than the second frame rate, and the first wavelength range is different from the second wavelength range. Alternatively, the image sensor circuit 100 may include a first control circuit 110 and a second control circuit 120 to control the pixel circuit 150. The first control circuit 110 controls the first sub-pixel circuit 112 to output the first output information at a first frame rate, while the second control circuit 120 controls the second sub-pixel circuit 122 to output the second output information at a second frame rate. The first frame rate is higher than the second frame rate, and the first wavelength range does not overlap with the second wavelength range.

Furthermore, for example, in the image sensor circuit 100 including a first control circuit 110 and a second circuit 120, the first control circuit 110 can control the first sub-pixel circuit 112 to expose for a first exposure duration and output the first sensing signal at a first frame rate, while the second circuit 120 can control the second sub-pixel circuit 122 to expose for a second exposure duration and output the second sensing signal at a second frame rate. For instance, the first exposure duration may be shorter than the second exposure duration, and the first frame rate may be higher than the second frame rate.

In other words, in actual implementation, the first control circuit 110 and the second control circuit 120 can be external control circuits located outside the image sensor circuit 100, or they can be located within the image sensor circuit 100 depending on actual requirements.

In the case where the first control circuit 110 and the second circuit 120 are located within the image sensor circuit 100, the first sub-pixel circuit 112 is designed to detect light within a first wavelength range. The first control circuit 110 is coupled to the first sub-pixel circuit and configured to control the first sub-pixel circuit 112 to output a first output information #D1 after a first exposure duration. The second sub-pixel circuit 122 is designed to detect light within a second wavelength range. The second control circuit 120 is coupled to the second sub-pixel circuit 122 and configured to control the second sub-pixel circuit 122 to output a second output information #D2 after a second exposure duration. The first control circuit 110 is further configured to control the first sub-pixel circuit 112 to output the first output information #D1 at a first frame rate, and the second control circuit 120 is further configured to control the second sub-pixel circuit 122 to output the second output information #D2 at a second frame rate. The first frame rate is higher than the second frame rate, and the first wavelength range and the second wavelength range are different.

In other words, the pixel circuit 150 in the embodiment is designed to include multiple sub-pixel circuits. Diverse types of filters (not shown) can be placed on each sub-pixel circuit to sense corresponding types of light. For example, the second sub-pixel circuit 122, the third sub-pixel circuit 124, and the fourth sub-pixel circuit 126 can be covered by filters of different wavelength ranges to correspond to different primary colors, resulting in the second output information #D2, the third output information #D3, and the fourth output information #D4. For example, the second sub-pixel circuit 122 can be covered by a red filter, the third sub-pixel circuit 124 can be covered by a green filter, and the fourth sub-pixel circuit 126 can be covered by a blue filter. The first sub-pixel circuit 112 can be covered by an infrared filter to output the first output information #D1, representing the detected amount of infrared light. In practice, the image data of each pixel circuit 150 can be composed based on the second output information #D2, the third output information #D3, and the fourth output information #D4. The first output information #D1 output from the first sub-pixel circuit 112 of each pixel circuit 150 in the pixel array of the image sensor circuit 100 can be collected to form motion sensitive images. Generally, after post-processing, image data can be turned into video files with a frame rate of 30 frames per second, which is suitable for live recording. The motion sensitive images can be used to determine changes in the scene and is suitable for various monitoring applications. The motion detection function does not require high resolution or vivid color recording, but requires a higher frame rate to detect transient changes in the scene. To increase the frame rate for motion detection, the first control circuit 110 can adjust the frame rate of the first output information #D1 output from the first sub-pixel circuit 112 to 120 frames per second or higher.

Regarding the first wavelength filter, in further derived embodiments, it can be an infrared filter or a white light filter (including all red, green, and blue bands). In another case, the first wavelength filter can also be set to a "no filter" type, which can receive visible and infrared light in the full spectrum. The advantage of infrared light is that it has higher sensitivity in low light or nighttime conditions, making it suitable for motion detection. The advantage of white light is that it covers the three bands of red, green, and blue, so its sensitivity is also high, making it suitable for motion detection. The no filter type can also maintain high sensitivity, making it suitable for motion detection.

In the embodiment of FIG. 2, the output terminals of the first pixel circuit 112, the second pixel circuit 122, the third pixel circuit 124, and the fourth pixel circuit 126 can share a floating diffusion node FD. The image sensor circuit 100 may further include a readout circuit 140, coupled to the floating diffusion node FD and operated according to a specific timing controlled by a reset signal RST, a selection signal SEL, and a transfer signal TX, to read the values output from the corresponding pixel circuits. The first control circuit 110 controls the first pixel circuit 112 to output the first output information #D1 according to the first frame rate, and the second control circuit 120 controls the second pixel circuit 122, the third pixel circuit 124, and the fourth pixel circuit 126 to output the second output information #D2, the third output information #D3, and the fourth output information #D4 according to the second frame rate. For example, the first control circuit 110 controls the exposure and reset timings of the first pixel circuit 112 through the first transfer signal TX1, and the second control circuit 120 controls the exposure and reset timings of the second pixel circuit 122, the third pixel circuit 124, and the fourth pixel circuit 126 respectively through the second transfer signal TX2, the third transfer signal TX3, and the fourth transfer signal TX4. The detailed timing of operations will be explained in FIG. 4. Since the processes of the second control circuit 120 controlling the second pixel circuit 122, the third pixel circuit 124, and the fourth pixel circuit 126 are basically the same, only the second pixel circuit 122 is selected as a representative to explain the operation of the second control circuit 120 and the second pixel circuit 122. The readout circuit 140 is coupled to the first pixel circuit 112 and the second pixel circuit 122 via the floating diffusion node FD and is configured to read the first output information #D1 and the second output information #D2. The first control circuit 110 and the second control circuit 120 can alternatively control the readout circuit 140 through the reset signal RST, so that the readout circuit 140 generates a readout signal #OUT according to the first output information #D1 or the second output information #D2.

In FIG. 2, although the first control circuit 110 and the second control circuit 120 are located within the image sensor circuit 100, the pixel circuit 150 includes the first sub-pixel circuit 112, the second sub-pixel circuit 122, the third sub-pixel circuit 124, and the fourth sub-pixel circuit 126. However, for the case where the first control circuit 110 and the second control circuit 120 are located outside of the image sensor circuit 100 while the pixel circuit 150 includes the first sub-pixel circuit 112 and the second sub-pixel circuit, or for the case where the first control circuit 110 and the second control circuit 120 are located within the image sensor circuit 100 while the pixel circuit 150 includes the first sub-pixel circuit 112 and the second sub-pixel circuit, the principles of operations are similar to those described in the present embodiment, so they will not be described again here.

Furthermore, although in FIG. 2, the image sensor circuit 100 comprises a pixel circuit 150, but for the image sensor circuit 100 comprising two or more pixel circuits 150, that is, the case that the image sensor circuit 100 comprises a plurality of pixel circuits 150, the principles of operations are the analogous to the present embodiment. Therefore, likewise, detailed are not repeated herein.

Although the four sub-pixel circuits shown in FIG. 2 share one floating diffusion node FD, it can be understood that in further derived embodiments, one or more sub-pixel circuits may not share the floating diffusion node FD, or do not share the readout circuit 140. For example, the sub-pixel circuit in the one-pixel circuit 150 may comprise a sub-pixel circuit (not shown) controlled by a first control circuit not coupled to the floating diffusion node FD, and three sub-pixel circuits that are coupled to the floating diffusion nodes FD and controlled by a second control circuit.

Figure 3:
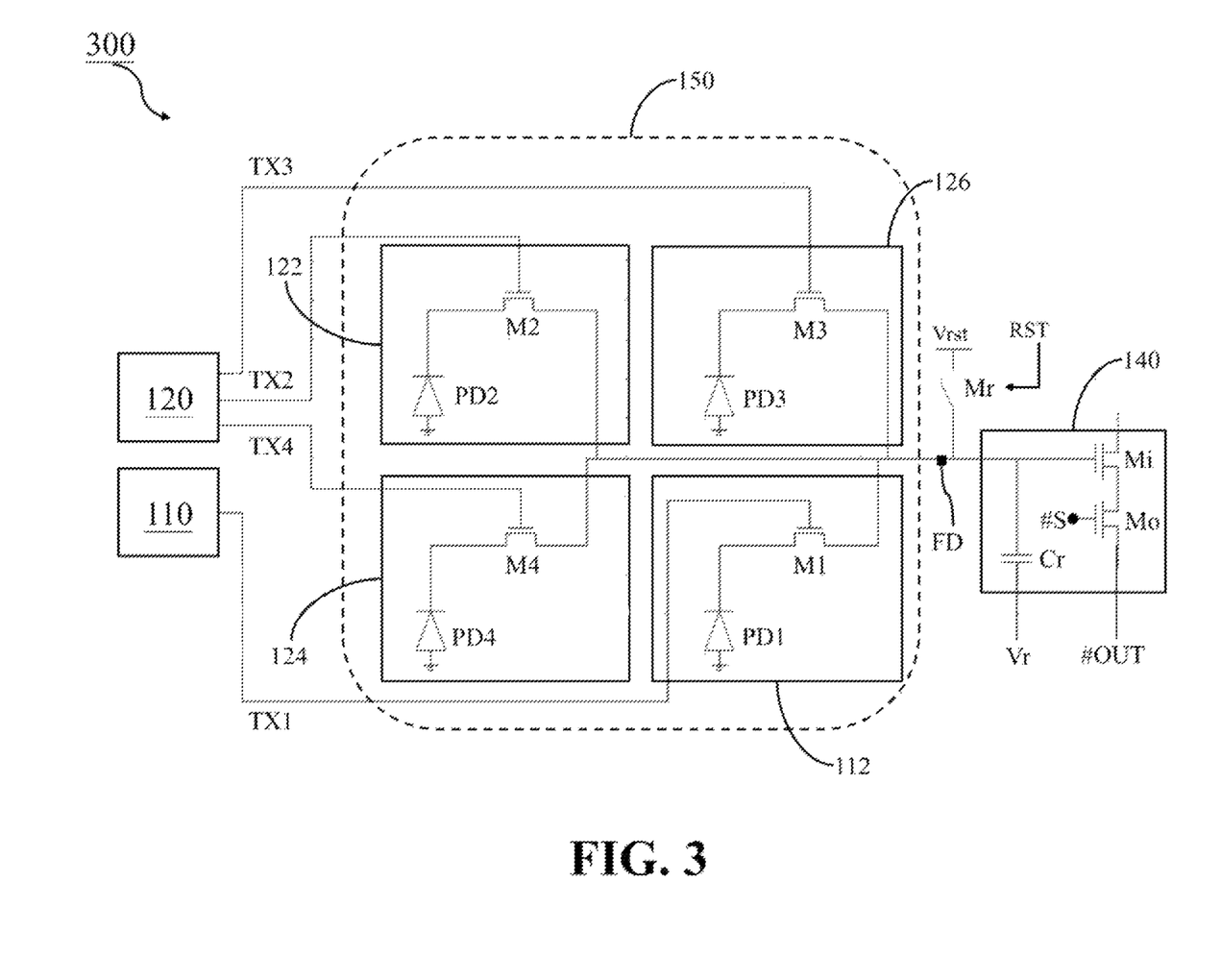
FIG. 3 shows an embodiment of a sensor circuit based on a rolling shutter structure of the present invention.

FIG. 3 shows a sensor circuit embodiment based on a rolling shutter structure. The pixel array (not shown) in the image sensor circuit 300 can be understood as a series of multiple pixel circuits 150 arranged in a row. The rolling shutter is operated by scanning each row of pixel circuits 150 using a selection signal #S. At any given time, only one row of pixel circuits 150 that is activated by the selection signal #S will perform data readout. Since the rolling shutter structure is a known technology, basic introductions are omitted.

In FIG. 3, the readout circuit 140 includes a ramp capacitor Cr. The function of the ramp capacitor is to couple a ramp voltage signal to a floating diffusion node FD, causing the voltage of the floating diffusion node FD to rise over time, which is then compared with a reference voltage to perform analog-to-digital conversion. One end of the ramp capacitor Cr is connected in series with a ramp voltage Vr. When the readout circuit 140 is controlled by a selection signal #S, the potential of the floating diffusion node FD can be converted to the readout signal #OUT according to a specific timing. In the embodiment of FIG. 3, the readout circuit 140 may include a readout circuit Mi and an output switch Mo. Generally, the readout circuit Mi is an amplifying transistor or a source follower, and the output switch Mo is a select transistor. When the select transistor is turned on, the signal from the floating diffusion node FD is amplified and transmitted to the output terminal. On the other hand, the floating diffusion node FD is also reset by a reset signal RST. For example, the floating diffusion node FD is coupled to a reset voltage Vrst through a switch. When the reset signal RST connects to the switch, the potential of the floating diffusion node FD is pulled to the reset voltage Vrst. Therefore, the reset signal RST, together with the first transmission signal TX1, the second transmission signal TX2, the third transmission signal TX3, and the fourth transmission signal TX4 output from the first control circuit 110 and the second control circuit 120, can cause the readout circuit 140 to sequentially read out the first output information #D1, the second output information #D2, the third output information #D3, and the fourth output information #D4 respectively output from the first sub-pixel circuit 112, the second sub-pixel circuit 122, the third sub-pixel circuit 124, and the fourth sub-pixel circuit 126. The design of the readout circuit 140 may vary with the actual product. The reset voltage Vrst is usually VDD or another reference voltage, and the ramp voltage Vr is a signal that ramps up or down over time. The embodiment of the present invention is not limited to the example shown in FIG. 3.

Figure 4:
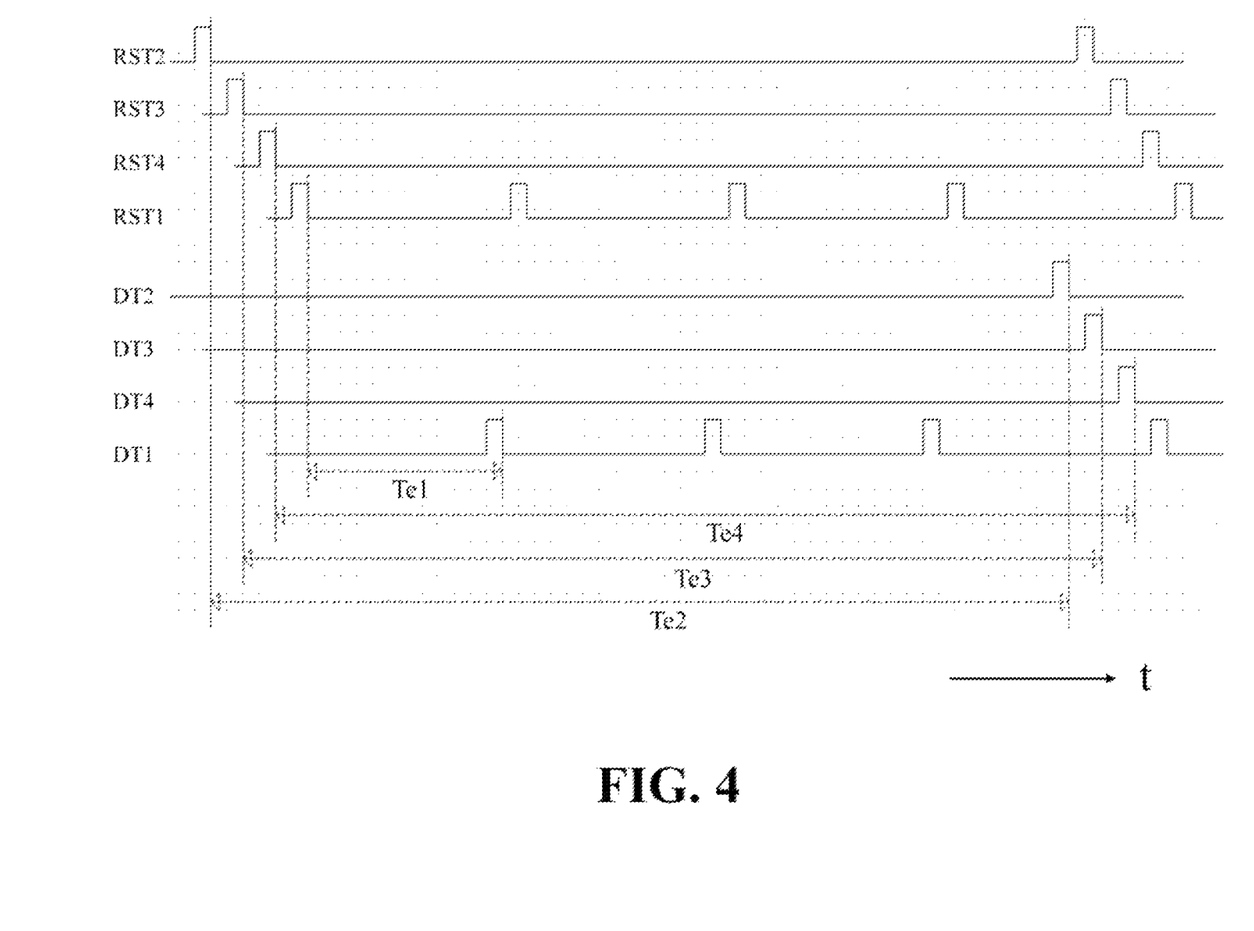
FIG. 4 shows a timing diagram of the operation of the sensor circuit based on the rolling shutter structure of the present invention.

In FIG. 3, the circuit structures of the first sub-pixel circuit 112, the second sub-pixel circuit 122, the third sub-pixel circuit 124, and the fourth sub-pixel circuit 126 can be similar except for the difference in the photosensitive ranges. The first control circuit 110 and the second control circuit 120 control the timing of the first transmission signal TX1, the second transmission signal TX2, the third transmission signal TX3, and the fourth transmission signal TX4, as well as the timing of the reset signal RST, to convert the first output information #D1, the second output information #D2, the third output information #D3, and the fourth output information #D4 respectively output from the first sub-pixel circuit 112, the second sub-pixel circuit 122, the third sub-pixel circuit 124, and the fourth sub-pixel circuit 126, into the readout signal #OUT in a specific timing order. For example, the second sub-pixel circuit 122, the third sub-pixel circuit 124, and the fourth sub-pixel circuit 126 can be sub-pixel circuits dedicated to capturing red, blue, and green colors, respectively, while the first sub-pixel circuit 112 is configured as a sub-pixel circuit dedicated to capturing infrared light. Taking the first sub-pixel circuit 112 as an example, the circuit structure is described as follows. The first sub-pixel circuit 112 includes a first photosensitive diode PD1, one end of which is coupled to the ground and the other end is coupled to a first switch M1. The first photosensitive diode PD1 is designed to be photosensitive and charge accumulable. The first switch M1 has a source and a drain, which are respectively coupled to the first photosensitive diode PD1 and the floating diffusion node FD. The gate of the first switch M1 is coupled to the first control circuit 110 and is switched to the conductive state according to the first transmission signal TX1 transmitted by the first control circuit 110. Similarly, the second sub-pixel circuit 122, the third sub-pixel circuit 124, and the fourth sub-pixel circuit 126 each include a photosensitive diode (PD2, PD3, PD4, respectively) and a switch circuit (M2, M3, M4, respectively), each respectively receiving the second transmission signal TX2, the third transmission signal TX3, and the fourth transmission signal TX4 to operate. The first sub-pixel circuit 112, the second sub-pixel circuit 122, the third sub-pixel circuit 124, and the fourth sub-pixel circuit 126 are coupled to the readout circuit 140 via a floating diffusion node FD. The control signals, the selection signal #S and the reset signal RST operated in diverse timings together cause the data sensed by each sub-pixel circuit to be converted into the readout signal #OUT and output to the subsequent processing unit through the readout circuit 140. FIG. 4 is used to explain the timing of the signal operation in the image sensor circuit 300.

FIG. 4 shows the timing diagram of the sensor circuit in one embodiment of the present invention. The horizontal axis represents the time t. The timings at which the first photodiode PD1, second photodiode PD2, third photodiode PD3, and fourth photodiode PD4 in the first sub-pixel circuit 112, second sub-pixel circuit 122, third sub-pixel circuit 124, and fourth sub-pixel circuit 126 are reset are respectively denoted as the first reset signal RST1, second reset signal RST2, third reset signal RST3, and fourth reset signal RST4. The timings at which the readout circuit 140 reads the first output information #D1, second output information #D2, third output information #D3, and fourth output information #D4 from the first sub-pixel circuit 112, second sub-pixel circuit 122, third sub-pixel circuit 124, and fourth sub-pixel circuit 126, respectively, are respectively denoted as the first readout timing DT1, second readout timing DT2, third readout timing DT3, and fourth readout timing DT4. The exposure duration of each photodiode can be calculated from the end of reset timing to the readout timing. Therefore, the exposure durations of the first photodiode PD1, second photodiode PD2, third photodiode PD3, and fourth photodiode PD4 are denoted as the first exposure duration Te1, second exposure duration Te2, third exposure duration Te3, and fourth exposure duration Te4, respectively.

In this embodiment, the exposure duration of the second photodiode PD2, the third photodiode PD3, and the fourth photodiode PD4 are set to the same length. In other words, every other time period, i.e., the second exposure duration Te2, #D2, #D3, and #D4 are respectively output once. The exposure duration of the first photodiode PD1 is set shorter, and its output frequency is higher. Within the time period for outputting data once by the second photodiode PD2, the third photodiode PD3, and the fourth photodiode PD4, the first photodiode PD1 can output data four times. In other words, the frame rate that the first photodiode PD1 can generate is four times that of the other sub-pixel circuits. In this embodiment, four times is just a reference setting, and other multiplication rates can be set according to practical needs. The multiplication rate can be an integer or a non-integer greater than one. For example, when #D2 is output twice, #D1 can be output seven times.

The first sub-pixel circuit 112 in FIG. 3 is taken as an example to describe an embodiment of the operation when the first photodiode PD1 is reset. The floating diffusion node FD in FIG. 3 is coupled to the first sub-pixel circuit 112, the second sub-pixel circuit 122, the third sub-pixel circuit 124, and the fourth sub-pixel circuit 126, and is also coupled to a reset voltage Vrst via a reset switch Mr. When the first control circuit 110 sends the first transmission signal TX1 to turn on the first switch M1 and sends a reset signal RST to turn on the reset switch Mr, the first switch M1 is coupled to the reset voltage Vrst via the floating diffusion node FD. The accumulated charges in the first photodiode PD1 is reset through the first switch M1 and the reset switch Mr. The reset voltage Vrst can be a specific reference voltage, such as the operating voltage VDD. The operation of resetting the second sub-pixel circuit 122, the third sub-pixel circuit 124, and the fourth sub-pixel circuit 126 is similar to that of the first sub-pixel circuit 112 and will not be described again.

The first sub-pixel circuit 112 of FIG. 3 is illustrated as an example to show the signal operations when data is read out from the first photodiode PD1.

When the first control circuit 110 sends the first transmission signal TX1 to turn on the first switch M1, but the reset switch Mr is not turned on by the reset signal RST, the accumulated charges in the first photodiode PD1 is transferred to the floating diffusion node FD. When the readout circuit 140 is triggered by the selection signal #S, the readout circuit 140 outputs the potential on the floating diffusion node FD, which is the first output information #D1, as the readout signal #OUT through the input circuit Mi and the output switch Mo. The readout signal #OUT represents the first readout signal sensed by the first sub-pixel circuit 112. The readout signal #OUT will be used for subsequent image-related signal processing, the details of which are based on conventional techniques and are not described in detail in this embodiment. The operations of reading out data from the second sub-pixel circuit 122, the third sub-pixel circuit 124, and the fourth sub-pixel circuit 126, are analogous to that of the first sub-pixel circuit 112, and will not be repeated here.

In summary, the first control circuit 110 and the second control circuit 120 in this embodiment can implement the timing shown in FIG. 4 by manipulating the timing of the first transmission signal TX1, the second transmission signal TX2, the third transmission signal TX3, and the fourth transmission signal TX4, as well as the timing of the reset signal RST, thus enabling the first sub-pixel circuit 112 to output data at a higher frame rate. The advantage of this embodiment is that each sub-pixel circuit in the pixel circuit 150 can output data at different frame rates to be suitable for at least two different image applications.

It can be understood that the aforementioned first switch M1, second switch M2, third switch M3, fourth switch M4, input circuit Mi, output switch Mo, and reset switch Mr can be implemented by various types of transistors. This embodiment does not limit the specific implementations.

Figure 5:
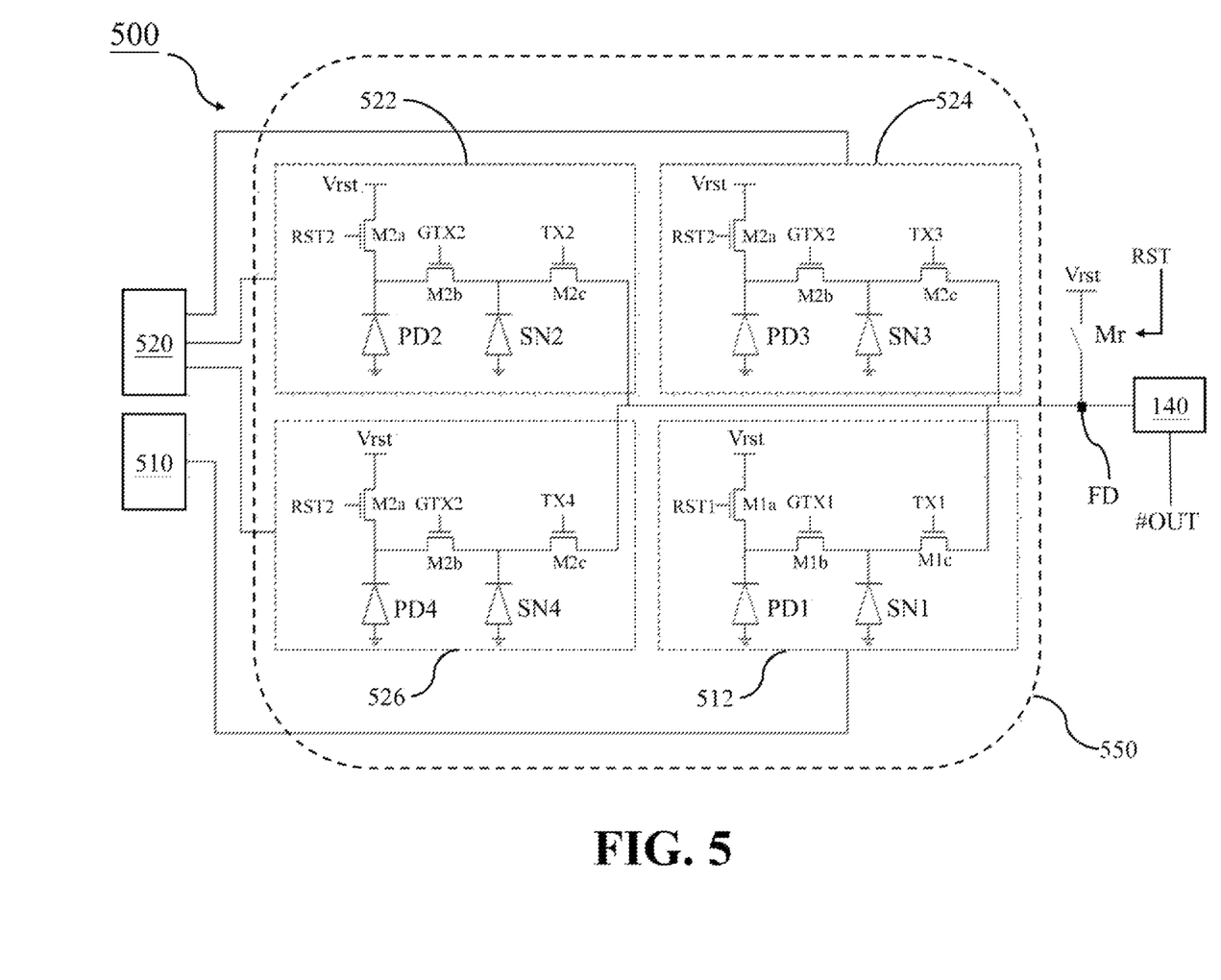
FIG. 5 shows an embodiment of the sensor circuit based on the global shutter structure of the present invention.

FIG. 5 is a schematic diagram of a sensor circuit structure of another embodiment in the present invention. In this embodiment, the image sensor circuit 500 can be a global shutter structure comprising a pixel array composed of multiple pixel circuits 550. Each pixel circuit 550 includes a first sub-pixel circuit 512, a second sub-pixel circuit 522, a third sub-pixel circuit 524, and a fourth sub-pixel circuit 526. The first sub-pixel circuit 512 is controlled by the first control circuit 510, while the second sub-pixel circuit 522, the third sub-pixel circuit 524, and the fourth sub-pixel circuit 526 are controlled by the second control circuit 520. The design of the floating diffusion node FD, the readout circuit 140, and the reset switch Mr is similar to the implementation in FIG. 3. Unlike the operation of the rolling shutter, all the pixel circuits 550 of the image sensor circuit 500 can be exposed at the same time, and each sub-pixel circuit in each pixel circuit 550 has independent local reset and local storage circuits for sequentially outputting the exposure results. The operation of the first sub-pixel circuit 512 is illustrated as an example.

The first sub-pixel circuit 512 includes a switch circuit M1a, a switch circuit M1b, a switch circuit M1c, a first photodiode PD1, and a first buffer circuit SN1. The setting of the first photodiode PD1 is similar to that in FIG. 3, which accumulates the first photographic quantity that can be photoelectrically detected. The first buffer circuit SN1 is coupled to the first photodiode PD1 via the switch circuit M1b. When the first global transmission signal GTX1 turns on the switch circuit M1b, the first buffer circuit SN1 can read and buffer the first photographic quantity from the first photodiode PD1.

The following describes an embodiment of the first sub-pixel circuit 512 being reset. After the first buffer circuit SN1 reads and buffers the first photographic quantity, the first photodiode PD1 can be reset to facilitate the next exposure operation. The first control circuit 510 sends a first reset signal RST1 to the first sub-pixel circuit 512, resetting the voltage level of the first photodiode PD1 to a reset voltage Vrst. Specifically, the source and drain of the switch circuit M1a in the first sub-pixel circuit 512 are respectively coupled to the reset voltage Vrst and the first photodiode PD1. When the first reset signal RST1 turns on the switch circuit M1a, the first photodiode PD1 is pulled to the reset voltage Vrst.

The following describes an embodiment of the first sub-pixel circuit 512 when data is read out. After the first photodiode PD1 completes the storage of the first photographic quantity, the first control circuit 510 first sends a reset signal RST to turn on the reset switch Mr, resetting the potential of the floating diffusion node FD. The first control circuit 510 then sends a first transmission signal TX1 to have the first buffer circuit SN1 transfer the first photographic quantity to the floating diffusion node FD. Specifically, the source and drain of the switch circuit M1c are respectively coupled to the first buffer circuit SN1 and the floating diffusion node FD. The first control circuit 510 is coupled to the gate of the switch circuit M1c. When the first control circuit 510 makes the switch circuit M1c conductive through the first transmission signal TX1, the first photographic quantity stored in the first buffer circuit SN1 is transferred to the floating diffusion node FD.

The structures and operations of the second sub-pixel circuit 522, third sub-pixel circuit 524, and fourth sub-pixel circuit 526 are similar to that of the first sub-pixel circuit 512. The difference is that the first sub-pixel circuit 512 is controlled by the first control circuit 510, while the second sub-pixel circuit 522, third sub-pixel circuit 524, and fourth sub-pixel circuit 526 are controlled by the second control circuit 520. Therefore, the frequencies and timings of the second global transmission signal GTX2, second transmission signal TX2, and reset signal RST2 are different.

For example, the second sub-pixel circuit 522 includes a second photodiode PD2, which is designed to be photosensitive that accumulates a photographic quantity. The second buffer circuit SN2 is coupled to the second photodiode PD2 and used to read and buffer the photographic quantity according to the second global transmission signal GTX2. After the second buffer circuit SN2 reads the photographic quantity, the second control circuit 520 sends a second reset signal RST2 to the second sub-pixel circuit 522 to reset the second photodiode PD2 to the reset voltage Vrst.

In this embodiment, the frequency at which the first control circuit 510 sends the first reset signal RST1 to the first pixel circuit 512 can be four times the frequency at which the second control circuit 520 sends the second reset signal RST2 to the second pixel circuit 522. In other words, within one operation cycle of the second reset signal RST2, the first reset signal RST1 can operate four times.

In this embodiment, after the second buffer circuit SN2 completes the buffer of the second photographic quantity, the second control circuit 520 first sends the second reset signal RST2 to reset the floating diffusion node FD, and then sends the second transmission signal TX2 to output the second photographic quantity from the second buffer circuit SN2 to the read circuit 140 and transmit it to the floating diffusion node FD. Similarly, the transmission frequency of the first transmission signal TX1 in this embodiment can be four times that of the second transmission signal TX2. That is, within one time period in which the second transmission signal TX2 resets the floating diffusion node FD and outputs data, the first transmission signal TX1 can reset and output data from the floating diffusion node FD four times.

Likewise, the third sub-pixel circuit 524 and fourth sub-pixel circuit 526 each containing a photodiode (PD3 and PD4) and a storage circuit (SN3 and SN4), receive the reset signal RST2 and global transmission signal GTX2 from the second control circuit 520, and further respectively receive the second transmission signal TX2 and third transmission signal TX3 sent by the second control circuit 520 to perform similar operations to the second sub-pixel circuit 522. Therefore, explanation thereof is not repeated.

Figure 6:
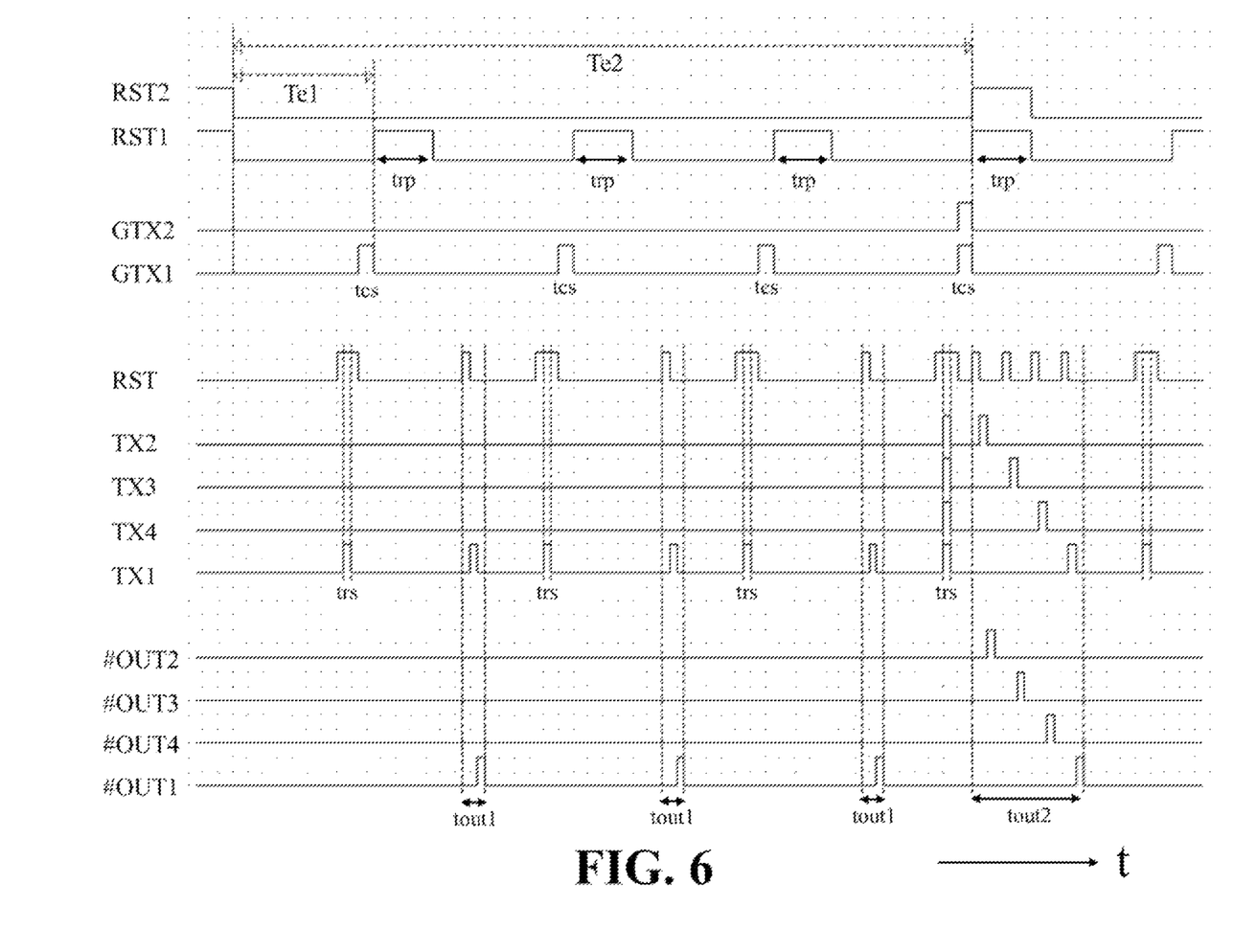
FIG. 6 shows a timing diagram of the operation of the sensor circuit based on the global shutter structure of the present invention.

FIG. 6 is a timing diagram of a sensor circuit in another embodiment of the present invention. In this embodiment, the exposure duration of the second pixel circuit 522, the third pixel circuit 524, and the fourth pixel circuit 526 are represented by Te2, and the exposure duration of the first pixel circuit 512 is represented by Te1. Taking the exposure duration Te1 of the first pixel circuit 512 as an example. The exposure duration Te1 of the first pixel circuit 512 starts from receiving the first reset signal RST1, and ends when the first control circuit 510 issues the first global transfer signal GTX1. As shown in FIG. 6, the duration of the first global transfer signal GTX1 represents the storage duration tcs1. During the storage duration tcs1, the switch circuit M1b in the first pixel circuit 512 is turned on by the first global transfer signal GTX1, which stores the accumulated charges in the first photodiode PD1 to the first storage circuit SN1.

After the completion of exposure in the first pixel circuit 512, the first control circuit 510 triggers the first reset signal RST1 and turns on the switch circuit M1a to reset the first photo diode PD1. In the example of FIG. 6, the time required for the first control circuit 510 to reset the first photo diode PD1 via the first reset signal RST1 is represented by the duration trp. After the first reset signal RST1 is turned off after a duration trp, the first photo diode PD1 in the first pixel circuit 512 can enter the exposure mode again.

It can be understood that the preceding switching circuits M1a, M1b, and M1c can be implemented by various transistors. The present embodiment does not limit the specific implementation.

As shown in FIG. 6, the first exposure duration Te1 is shorter than the second exposure duration Te2. In this embodiment, the first wavelength range received by the first pixel circuit 512 can be infrared light, white light, or the entire wavelength range of white light plus infrared light. The second wavelength ranges received by the second pixel circuit 522, the third pixel circuit 524, and the fourth pixel circuit 526 can be red light, green light, and blue light, respectively. The first pixel circuit 512 outputs data at a first frame rate, while the second pixel circuit 522, the third pixel circuit 524, and the fourth pixel circuit 526 output data at a second frame rate. The first frame rate can be an integer multiple or non-integer multiple of the second frame rate.

In the embodiment of FIG. 6, the first global transmission signal GTX1 output from the first control circuit 510 is more frequent than the second global transmission signal GTX2 output from the second control circuit 520. For example, the first control circuit 510 sends the first global transmission signal GTX1 to the first sub-pixel circuit 512, which causes the first storage circuit SN1 in the first sub-pixel circuit 512 to buffer the first photographic quantity captured by the first photodiode PD1 based on the first global transmission signal GTX1. As shown in FIG. 6, the duration of the first global transmission signal GTX1 being open is represented by the storage time tcs. Similarly, the second control circuit 520 sends the second global transmission signal GTX2 to the second sub-pixel circuit 522, which causes the second storage circuit SN2 in the second sub-pixel circuit 522 to buffer the second photographic quantity captured by the second photodiode PD2 based on the second global transmission signal GTX2. As shown in FIG. 6, the duration of the second global transmission signal GTX2 being open is represented by the storage time tcs. In this embodiment, the transmission frequency of the first global transmission signal GTX1 is four times that of the transmission frequency of the second global transmission signal GTX2.

In the example of the first pixel circuit 512, the first control circuit 510 uses reset signal RST and the first transmission signal TX1 to allow the readout circuit 140 to read out the first photographic quantity stored in the first storage circuit SN1 of the first pixel circuit 512.

Before the first photodiode PD1 in the first pixel circuit 512 completes exposure, the first control circuit 510 can be triggered by the reset signal RST and the first transmission signal TX1 simultaneously to reset the first storage circuit SN1. As shown in FIG. 6, the duration for resetting the first storage circuit SN1 is represented by the storage reset duration trs.

After the first photodiode PD1 is reset by the reset signal RST for a sensor reset duration trp, the first control circuit 510 performs a data readout procedure for a first output duration tout1. The first output information #D1 is read from the first storage circuit SN1 of the first pixel circuit 512 to the readout circuit 140, and output as a readout signal #OUT1. As shown in FIG. 6, in the data readout procedure for the first output duration tout1, the first control circuit 510 first resets the floating diffusion node FD through the reset signal RST. Then, the first control circuit 510 sends a first transmission signal TX1 to turn on the switch circuit M1c in the first pixel circuit 512, so that the first sensing data stored in the first storage circuit SN1 is transferred to the floating diffusion node FD. Finally, the output switch Mo in the readout circuit 140 is opened according to the selection signal #S, and the corresponding #readout signal #OUT1 is output based on the potential level of the floating diffusion node FD.

In this embodiment, the second sub-pixel circuit 522, the third sub-pixel circuit 524, and the fourth sub-pixel circuit 526 also respectively operate similarly by receiving the second transmission signal TX2, the third transmission signal TX3, and the fourth transmission signal TX4 issued by the second control circuit 520. During each time period of exposure, buffer, and output of the second sub-pixel circuit 522, the third sub-pixel circuit 524, and the fourth sub-pixel circuit 526, the first sub-pixel circuit 512 can perform four cycles of exposure, buffer, and output. Therefore, in terms of timing, there will be situations such as the second output period tout2, during which the first control circuit 510 and the second control circuit 520 simultaneously reset the first storage circuit SN1, the second storage circuit SN2, the third storage circuit SN3, and the fourth storage circuit SN4 by using the reset signal RST and the first transmission signal TX1, the second transmission signal TX2, the third transmission signal TX3, and the fourth transmission signal TX4 with a reset storage duration trs. Then, in the time period shown in the second output period tout2, the first sub-pixel circuit 512, the second sub-pixel circuit 522, the third sub-pixel circuit 524, and the fourth sub-pixel circuit 526 sequentially output the readout signals #OUT1, #OUT2, #OUT3, and #OUT4.

The operational timing of FIG. 6 is based on one of the implementation examples of the circuit in FIG. 5. It can be understood that in practice, the output rate provided by the first control circuit 510 is not limited to four times. The operations of reset, buffering, and readout in the global shutter operation can be flexibly adjusted according to various circuit designs. The implementation example in FIG. 6 demonstrates at least the following advantages. By providing timing control with different functional requirements through the first control circuit 510 and the second control circuit 520, the pixel circuit 550 can obtain two different image sensing effects with different functional requirements.

Figure 7:
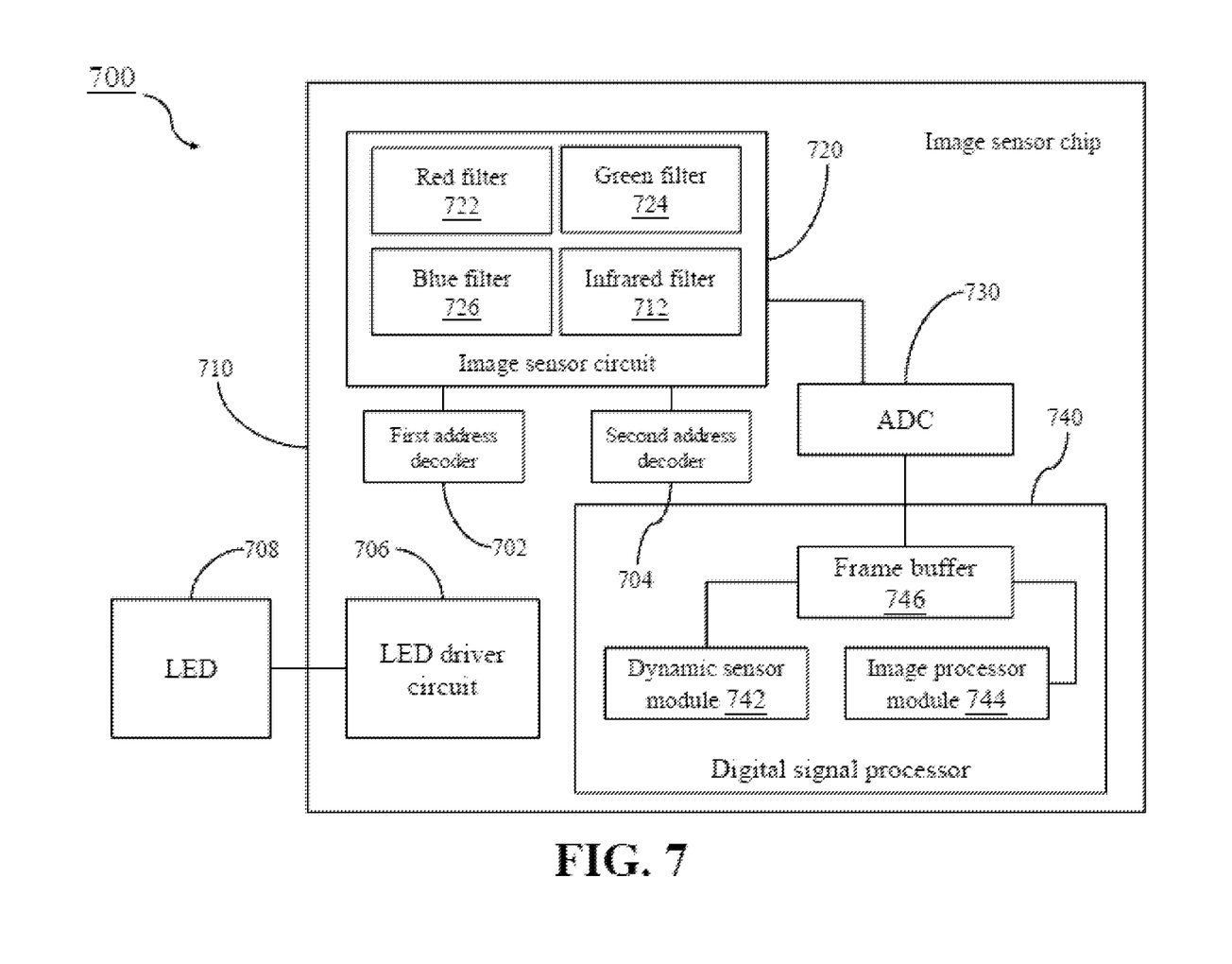
FIG. 7 shows an architecture diagram of an image sensor device according to an embodiment of the present invention.

FIG. 7 is a block diagram of an image sensor device 700 according to an embodiment of the present invention. Based on the previous embodiment, the present invention can further provide an image sensor device 700 suitable for various application scenarios that require simultaneous detection of movement and image capture, such as security cameras, driving recorders, or electric vehicle autonomous driving systems. The image sensor device 700 can include an image sensor circuit 720, which can be implemented in the form of a system-on-chip or an application-specific integrated circuit (ASIC). For example, the image sensor device 700 can include an image sensor chip 710, and the image sensor circuit 720 can be a part of the image sensor chip 710. The image sensor circuit 720 can be designed according to the image sensor circuit 200 in FIG. 3 or the image sensor circuit 500 in FIG. 5, and includes multiple pixel circuits as shown in FIG. 3 or FIG. 5. Each pixel circuit in the pixel circuits can be covered with different types of filters. For example, the first pixel circuit 112 in FIG. 3 or the first pixel circuit 512 in FIG. 5 can be covered with an infrared filter 612, set to detect infrared light. The second pixel circuit 122, the third pixel circuit 124, and the fourth pixel circuit 126 in FIG. 3 or the second pixel circuit 522, the third pixel circuit 524, and the fourth pixel circuit 526 in FIG. 5 can be covered with visible light filters, such as a red filter 722, a green filter 724, and a blue filter 726, for sensing corresponding visible light ranges. It can be understood that the wavelength ranges covered by the filters of the three primary colors are different from each other. The image sensor device 700 also includes a first address decoder 702 and a second address decoder 704, which are used to provide control signals with different frame rates to different sub-pixel circuits in the image sensor circuit 720. The image sensor device 700 further includes an analog-to-digital converter 730 coupled to the image sensor circuit 720. The original voltage or current signal sensed by the image sensor circuit 720 is first sent to the analog-to-digital converter 730. The analog-to-digital converter 730 can convert the signal into a digital format and then send it to the digital signal processor 740 for processing. The digital signal processor 740 can separately process the motion detection function and the image recording function with the help of the first address decoder 702 and the second address decoder 704. It can be understood that the first address decoder 702 and the second address decoder 704 can be designed with reference to the first control circuit 110 and the second control circuit 120 in FIG. 3 or the first control circuit 510 and the second control circuit 520 in FIG. 5. The first address decoder 702 can convert the infrared light signal sensed by the first sub-pixel circuit covered by the infrared filter 612 according to the first frame rate into a dynamic sensing signal. The second address decoder 704 can convert the visible light signal sensed by the other sub-pixel circuits covered by other visible light filters (such as the red filter 722, green filter 724, and blue filter 726) according to the second frame rate into an image signal. For example, the digital signal processor 740 can include a dynamic sensor module 742 and an image processing module 744, which are responsible for diverse types of sensing functions. The dynamic sensor module 742 can quickly sense the dynamic changes in the image based on the digital data output by the analog-to-digital converter 730 at the first frame rate. The image processing module 744 can process the digital data output by the analog-to-digital converter 730 at the second frame rate, such as compression, encoding, sharpening, etc., to generate and output high-quality video images.

In further embodiments, to enhance the image acquisition capability of the image sensor circuit 720, the image sensor device 700 can further include a light-emitting diode (LED) driving circuit 706 for driving an LED 708 to illuminate the target space or object. The actual design of the image sensor device 700 can be flexible depending on the application scenario. The description of FIG. 7 is only for illustrative purposes and is not intended to be limiting.

In the embodiment of FIG. 7, the digital signal processor 740 includes a frame buffer 746 for storing digital data output from the analog-to-digital converter 730. For example, the frame buffer 746 stores multiple sensed signals. When the dynamic sensor module 742 performs motion detection, it reads digital data from the frame buffer 746 for two or more consecutive frames, and performs differential comparison to determine motions.

For example, the frame buffer 746 can be used to store the previous image, so that it is available for further processing when the signal of the second image comes in. In general, the method for detecting motion in DVS is to subtract the pixel values of two consecutive frames. Therefore, the analog-to-digital converter 730 can buffer the pixel values of the first and second images in the frame buffer 746, and the dynamic sensor module 742 can then read the pixel values of the first and second images from the frame buffer 746 and subtract them to detect motions.

The image processor module 744 reads the digital data generated by multiple sub-pixel circuits that correspond to a single pixel from the frame buffer 746 when generating a video image. It performs a specific fusion algorithm using the parameters of each sub-pixel circuit, such as exposure duration, gain value, or weighting coefficients, to combine the digital data into the pixel's image value. The resulting video image generated by the image processor module 744 is a fusion of information from all sub-pixels, and the spatial resolution is lossless. Therefore, there is no decrease in image quality. In the present embodiment, the image signal is in RGB format and the infrared dynamic signal DVS(IR) is generated on the same chip. The two signals can also be fused in the same chip.

Figure 8:
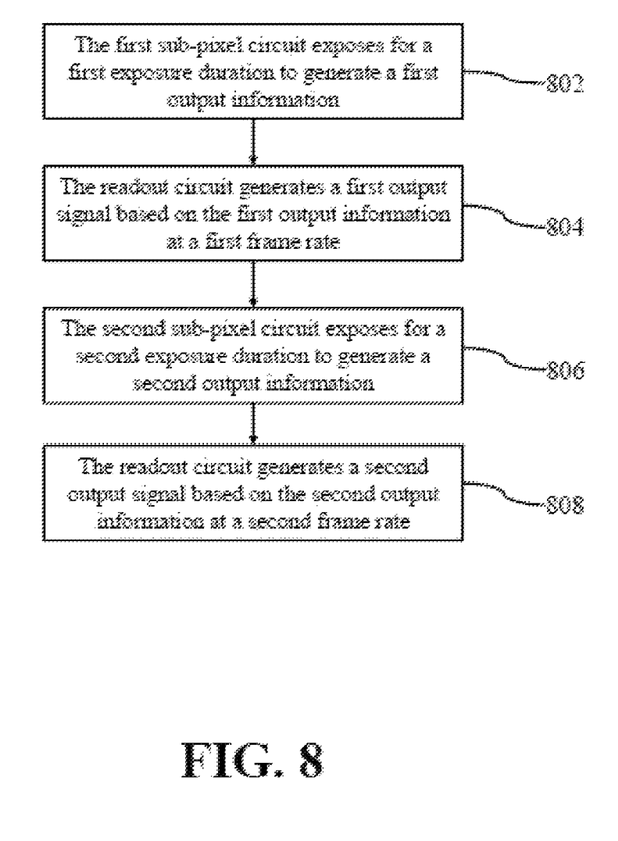
FIG. 8 is a method for operating the sensor circuit according to an embodiment of the present invention.

FIG. 8 shows an operation method of the sensor circuit according to an embodiment of the present invention. The operation process of the control circuit in the image sensor circuits 200 and 500 in FIG. 3 and FIG. 5 can be summarized into the following steps. In step 802, the first control circuit controls the first pixel circuit to generate the first output information by exposing for the first exposure duration. In step 804, the first control circuit controls the readout circuit to generate the first output signal according to the first output information at the first frame rate. In step 806, the second control circuit controls the second pixel circuit to generate the second output information by exposing for the second exposure duration. In step 808, the second control circuit controls the readout circuit to generate the second output signal according to the second output information at the second frame rate. It should be noted that although steps 802 to 808 are sequentially described in this embodiment, the order of execution of these steps is not limited. For example, steps 802 and 806 can be performed simultaneously, or steps 804 and 808 can be performed simultaneously. Similarly, steps 802 and 808, as well as steps 804 and 806 can also be performed simultaneously.

It should be noted that in this document, the terms "include", "comprise" or any other variations are intended to cover non-exclusively including, such that the process, method, article or apparatus comprising a series of elements not only includes those elements explicitly listed, but also includes other elements that are not explicitly listed, or are inherent in such a process, method, article, or apparatus. Unless otherwise limited, elements specifically stated as being "including a . . . " do not exclude other identical elements in the process, method, article or apparatus that includes the specified element.

The embodiments of the present invention are described above in combination with the drawings, but the present invention is not limited to the above specific embodiments, the above specific embodiments are only indicative, not restrictive, the usual knowledge of the art under the inspiration of the present invention, without departing from the scope of protection of the object and claims of the present invention, can also make many forms, are within the protection of the present invention.

What is claimed is:

1. An image sensor device comprising an image sensor circuit, wherein the image sensor circuit comprises at least one pixel circuit, and each of the at least one pixel circuit comprises:
    a first sub-pixel circuit, capable of sensing light in a first wavelength range and generating a first sensed signal at a first frame rate;
    a second sub-pixel circuit, capable of sensing light in a second wavelength range and generating a second sensed signal at a second frame rate;
    a conversion circuit, coupled to the image sensor circuit, capable of converting the first sensed signal and the second sensed signal to digital forms; and
    a processor circuit, coupled to the conversion circuit, capable of performing motion detections on the first sensed signal in the digital forms, and performing image processes on the second sensed signal in the digital forms;
    wherein while the processor circuit performs an image process on the second sensed signal, the processor circuit performs multiple motion detections on a plurality of the first sensed signals.

2. The image sensor device according to claim 1, further comprising:
    a first control circuit, arranged to be capable of controlling the first sub-pixel circuit to expose for a first exposure duration and outputting the first sensed signal at the first frame rate; and
    a second control circuit, arranged to be capable of controlling the second sub-pixel circuit to expose for a second exposure duration and outputting the second sensed signal at the second frame rate.

3. The image sensor device according to claim 2, wherein the first frame rate is higher than the second frame rate.

4. The image sensor device according to claim 1, wherein the processor circuit generates an image with a full spatial resolution after performing the image process on the second sensed signal.

5. An image sensor device for motion detection and image capture, comprising:
    an image sensor chip, comprising an image sensor circuit that includes multiple pixel circuits, wherein each pixel circuit comprises:
    a first sub-pixel circuit for sensing infrared light; and
    a second sub-pixel circuit for sensing visible light;
    wherein the image sensor chip further comprises:
    an analog-to-digital converter, coupled to the image sensor circuit and configured to convert infrared light signals sensed by the first sub-pixel circuit at a first frame rate into motion detection signals, and to convert visible light signals sensed by the second sub-pixel circuit at a second frame rate into an image signal;
    an image processor module, coupled to the analog-to-digital converter, and used for encoding, storing, and outputting of the image signal to generate video data;
    a dynamic sensor module, coupled to the analog-to-digital converter and used for determining changes in the motion detection signals, wherein the first frame rate is higher than the second frame rate; and
    a frame buffer coupled to the analog-to-digital converter, the image processor module, and the dynamic sensor module for buffering the motion detection signals and the image signals;
    wherein the dynamic sensor module reads two consecutive motion detection signals from the frame buffer to perform a differential comparison so as to determine image motion changes, and the image processor module applies a fusion algorithm to a plurality of the motion detection signals and the image signals to synthesize the video data with a lossless spatial resolution.

6. The image sensor device according to claim 5, further comprising a third sub-pixel circuit and a fourth sub-pixel circuit for sensing visible light, wherein the second, third, and fourth sub-pixel circuits operate at the second frame rate to generate second sensed signals.

7. The image sensor device according to claim 6, wherein the second sub-pixel circuit, the third sub-pixel circuit, and the fourth sub-pixel circuit are respectively used for sensing red, green, and blue light.

8. The image sensor device according to claim 6, wherein output terminals of the first sub-pixel circuit, the second sub-pixel circuit, the third sub-pixel circuit, and the fourth sub-pixel circuit are coupled to a floating diffusion node, and each of the first sub-pixel circuit, second sub-pixel circuit, third sub-pixel circuit, and fourth sub-pixel circuit is respectively controlled by a transmission signal to transfer respective sensed signals to the floating diffusion node.

9. The image sensor device of claim 8, further comprising a readout circuit, coupled to the floating diffusion node, and controlled by a reset signal and a selection signal to operate following a specific timing sequence, allowing the readout circuit to read output values respectively from the first sub-pixel circuit, second sub-pixel circuit, third sub-pixel circuit, or fourth sub-pixel circuit.

10. The image sensor device as claimed in claim 5, further comprising:
   a light-emitting diode coupled to the image sensor chip for emitting infrared light; and
   a light-emitting diode driver circuit coupled to the light-emitting diode for driving the light-emitting diode.

\* \* \* \* \*